United States Patent [19]

Rahman

[11] 4,441,072

[45] Apr. 3, 1984

[54] MULTIPLE INPUT OUTPUT ELECTRICAL ISOLATION FOR USE WITH ELECTRONIC INTEGRATED CIRCUITS

[75] Inventor: Mona A. Rahman, Minnetonka, Minn.

[73] Assignee: Honeywell Inc., Minneapolis, Minn.

[21] Appl. No.: 397,649

[22] Filed: Jul. 12, 1982

[51] Int. Cl.³ .............................................. H03H 1/00
[52] U.S. Cl. .................................. 323/368; 323/352; 332/51 R; 338/32 R
[58] Field of Search ............... 307/309; 323/294, 352, 323/353, 364, 365, 367, 368, 303; 332/51 R; 338/32 R; 363/147

[56] References Cited

U.S. PATENT DOCUMENTS

| | | | |
|---|---|---|---|
| 2,941,163 | 6/1960 | Hess, Jr. | 332/51 R |
| 3,396,328 | 8/1968 | Yuan | 323/368 |
| 3,462,673 | 8/1969 | Hieronymus | 323/368 |

*Primary Examiner*—William M. Shoop
*Attorney, Agent, or Firm*—Stephen W. Buckingham

[57] ABSTRACT

A plurality of electrical isolation devices are provided on a monolithic integrated circuit. Each of the isolation devices includes a current strap and a magnetic field sensor. The current strap is adapted to carry an electrical current representative of a signal to be transferred through that isolation device. The strength of the magnetic field produced by that current is measured by the magnetic field sensor.

12 Claims, 3 Drawing Figures

MULTIPLE INPUT OUTPUT ELECTRICAL ISOLATION FOR USE WITH ELECTRONIC INTEGRATED CIRCUITS

The present invention relates to isolation means for use between relatively higher voltage circuits and lower voltage circuits capable of being provided as a part of a monolithic integrated circuit, and more specifically to such integrated circuits having a plurality of such isolation means located thereon.

BACKGROUND OF THE INVENTION

In the field of electronics a common desire is to provide a group of signals to a processing circuit while maintaining electrical isolation between the circuit or circuits in which those signals were generated and the processing circuitry. A typical example of a situation where such a desire would arise is when signals from a group of sensors, operating in a relatively higher voltage range, are to be processed by a circuit which operates in a lower voltage range. Those skilled in the art will readily see other situations in electronics where similar isolation is desirable.

Typically in the prior art when such isolation was desired in the context of integrated circuits it was provided either externally to those integrated circuits, by the use of a transformer arrangement, or by the use of an optical system. Transformers are typically rather bulky devices when compared with other electronic components typically associated with integrated circuits. Therefore, transformers are provided external to an integrated circuit chip. Isolation by use of optical techniques is accomplished by modulation of the signal emitted by an optically emitting device, such as a light emitting diode, by the signal to be transferred. The emitter used in such a system is positioned so that the radiation thus emitted strikes a detector. The output of this detector may then be transferred to processing circuitry. Because it is difficult to prevent radiation emitted by one emitter from striking all detectors located on a single monolithic integrated circuit chip, typically only one such detector, and hence only one isolation device, may be provided on a single chip.

SUMMARY OF THE INVENTION

The present invention provides a plurality of isolation devices on a single monolithic integrated circuit. Each isolation device includes a magnetic field sensor and a current strap. The current strap is adapted to carry an electric current representative of a signal to be transferred through that isolation device. The strength of the magnetic field produced by that current is measured by the magnetic field sensor. The concept of the magnetic field sensor is then transferred to subsequent circuitry.

DETAILED DESCRIPTION OF THE PREFERRED EMBODIMENT

The present invention provides multiple isolation devices on a single monolithic integrated circuit chip. For the purposes of the description of the preferred embodiment an analog and a digital data acquisition device will be described, but those skilled in the art will realize that the invention is not limited to these functions.

Figure 1:
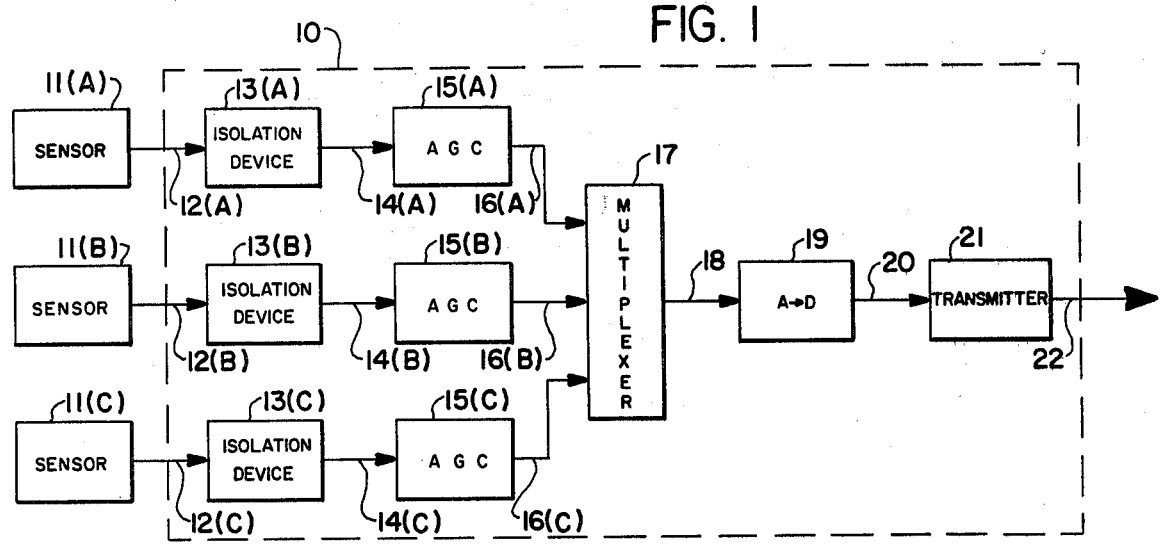
FIG. 1 shows a preferred embodiment of a data acquisition device for use with analog data.

Turning now to FIG. 1 there is shown a preferred embodiment of a data acquisition device for use with analog data. In FIG. 1 all blocks shown within dashed box 10 are to be implemented on a single monolithic integrated circuit chip. The system shown in FIG. 1 includes three external sensors 11(A), 11(B), and 11(C). Corresponding to these three sensors are three isolation devices 13(A), 13(B), and 13(C), and three automatic gain control amplifiers 15(A), 15(B), and 15(C). The invention is not limited to the use of three sensors to provide input signals, but could be implemented with any number desired.

In order to simplify the discussion of the invention the signal path for the output signal from sensor 11(A) will be traced. The signal paths for the output signals from sensors 11(B) and 1(C) run parallel to that for the output signal from sensor 11(A) and so will not be described in detail.

Signal line 12(A) is electrically connected to the output rgion of sensor 11(A) and to the inut region of isolation device 13(A). Thus the electrical output signal of sensor 11(A) is connected to the input region of isolation device 13(A). Isolation device 13(A) produces an output signal at an isoaltion device output region. This output signal from isolation device 13(A) is representative of the signal provided at the input region of isolation device 13(A). This output signal from isolation device 13(A) is provided without a direct electrical interconnection between the input and output regions of isolation device 13(A). Electrical conductor 14(A) is electrically connected to the output region of isolation device 13(A) and to the input region of an automatic gain control amplifier 15(A).

The output region of automatic gain control amplifier 15(A) is electrically connected to electrical conductor means 16(A). Electrical conductor means 16(A) is also electrically connected to one input region of multiplexer 17. The output signals from sensors 11(B) and 11(C) are carried through paths parallel to those described above to electrical conductor means 16(B) and 16(C). Electrical conductor means 16(B) and 16(C) are in turn electrically connected to other input regions of multiplexer 17. Multiplexer 17 combines the signals from lines 16(A), 16(B), and 16(C) into a single signal which may later be decoded into the separate signals if so desired. The single signal from multiplexer 17 is provided to an output region which is electrically connected to electrical conductor means 18. Electrical conductor means 18 is also electrically connected to the input region of an analog to digital converter, 19.

Analog to digital converter 19 produces a digital signal which is representative of the analog signal which was the output signal from multiplexer 17. The digital output signal of analog to digital converter 19 is provided to an output region which is electrically connected to electrical conductor means 20. Electrical conductor means 20 is further electrically connected to a transmitter 21. Transmitter 21 provides any necessary amplification or other signal conditioning needed to transmit the signal from the integrated circuit represented by block 10 to other subsequent circuitry for other use. Electrical conductor means 22 is electrically connected to the output region of transmitter 21 and conducts the digital signal representing the output signals of sensors 11(A), 11(B), and 11(C) off of the integrated circuit chip represented by block 10.

Figure 2:
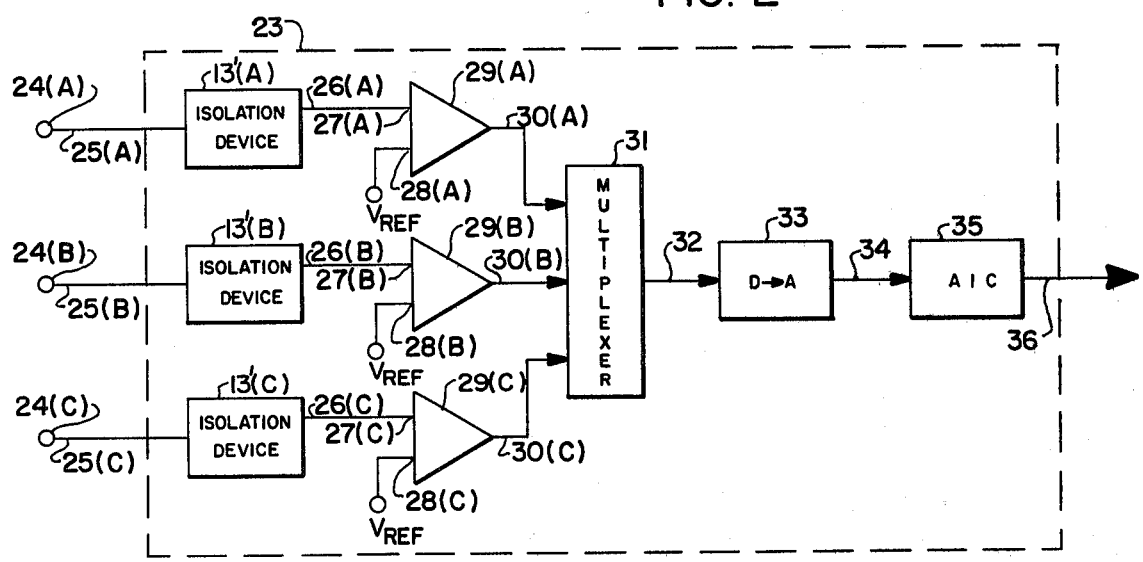
FIG. 2 shows a data acquisition device for use with digital data.

Turning now to FIG. 2 a data acquisition device for use with digital data is shown. In FIG. 2 everything shown within block 23 would typically be provided on a single monolithic integrated circuit. The system of FIG. 2 includes three input regions 24(A), 24(B), and 24(C). Each of these input regions is adapted to receive a relatively high voltage digital signal. As in the system of FIG. 1 although only three input regions are shown, the invention is not limited to a system utilizing three inputs. Any number desired could be provided within the scope of the invention.

The signal path for signals received at each of input regions 24(A), 24(B), and 24(C) are parallel. Therefore, only the signal path for signals received at input region 24(A) will be described. Electrical conductor means 25(A) is electrically connected to input region 24(A) and to the input region of isolation device 13'(A). Isolation device 13'(A) produces an output signal at an output region. This output signal is representative of the signal which arrived at the input region of isolation device 13'(A). This output signal is produced without any direct electrical connection between the input region and the output region of isolation device 13'(A).

The output region of isolation device 13'(A) is electrically connected to electrical conductor 26(A). Electrical conductor 26(A) is also electrically connected to input region 27(A) of comparator 29(A). A second input region, 28(A) of comparator 29(A) is electrically connected to the source of a reference voltage, $V_{REF}$. Comparator 29(A) produces an output signal indicative of the value of the input signal arising at input 27(A). This output signal is produced at the output region which is electrically connected to electrical conductor line 30(A). Electrical conductor means 30(A) is electrically connected to an input region of multiplexer 31. Electrical conductor means 30(B) and 30(C) are electrically connected to other input regions of multiplexer 31. Multiplexer 31 combines the individual digital signals arriving at each of its input regions into a single signal which is provided on output line 32. Output line 32 is electrically connected to an input region of digital to analog converter 33. Digital to analog converter 33 produces an analog signal representative of the digital signal coming from multiplexer 31. Electrical conductor line 34 is electrically connected to the output region of digital to analog converter 33 and to the input region of actuator interface circuitry 35. Actuator interface circuitry 35 conditions the signal in such a manner as to allow it to be used to control an outside electrical circuit or mechanical device. The output from actuator interface circuitry 35 is electrically connected to electrical conductor line 36, which in turn is electrically connected to the actuator to be controlled by the circuit.

Figure 3:
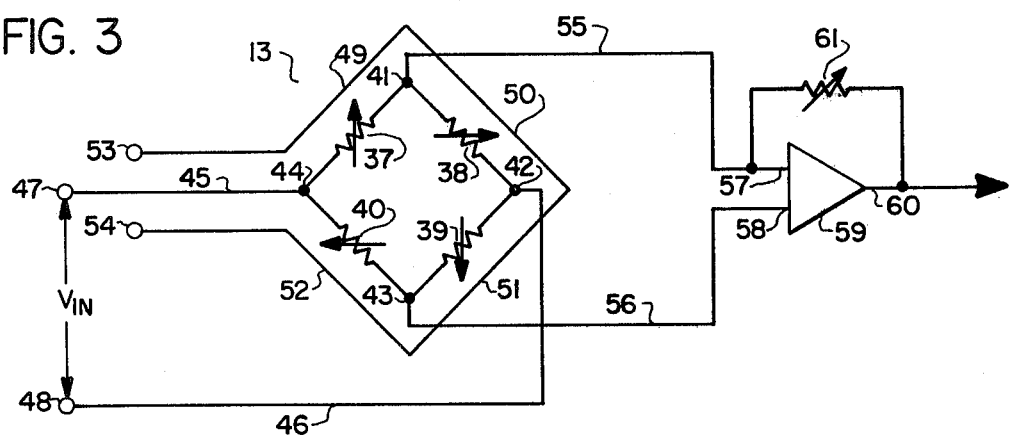
FIG. 3 shows an electrical schematic diagram of an isolation device.

The description above illustrates two examples of situations in which a plurality of isolation devices on a single monolithic integrated circuit chip is advantageous. FIG. 3 shows an electrical schematic diagram of an isolation device which may be used as one of a plurality of such isolation devices on a single monolithic integrated circuit chip. The circuit in FIG. 3 includes magnetoresistors 37, 38, 39, and 40 arranged in a Wheatstone bridge structure. In forming the bridge structure magnetoresistor 37 is electrically connected to magnetoresistor 38 at node 41. Similarly magnetoresistor 38 is electrically connected to magnetoresistor 39 at node 42, magnetoresistor 39 is electrically connected to magnetoresistor 40 at node 43 and magnetoresistor 37 is electrically connected to magnetoresistor 40 at node 44. Electrical conductor means 45 and 46 are electrically connected to nodes 44 and 42 and to terminating regions 47 and 48 respectively. An electrical potential difference is provided between terminating regions 47 and 48 in order to provide the input voltage for the bridge structure.

Electrical conductor means 49, 50, 51, and 52 are provided adjacent to magnetoresistors 37, 38, 39, and 40 respectively. Electrical conductor means 49, 50, 51, and 52 may be connected so as to form a single electrical conductor as shown or may be provided independently of one another. Electrical conductor means 49, 50, 51, and 52 are electrically connected to terminating regions 53 and 54. Electrical potentials are provided to terminating regions 53 and 54 such that an electrical current is established through electrical conductor means 49, 50, 51, and 52. This electrical current is representative of the signal to be transferred through isolation device 13. The electrical current traveling through electrical conductor means 49, 50, 51, and 52 will produce a magnetic field at magnetoresistors 37, 38, 39, and 40 respectively. As the current traveling through those electrical conductor means changes the associated magnetic fields will change also. This in turn will cause a change in the electrical resistance of magnetoresistors 37, 38, 39, and 40. If electrical conductor means 49, 50, 51, and 52 are laid out properly with respect to magnetoresistors 37, 38, 39, and 40, and proper biasing magnetic fields are provided to those magnetoresistors, the electrical resistances of magnetoresistors 37 and 39 may be made to increase when those of magnetoresistors 38 and 40 decrease. As the electrical resistances of those magnetoresistors changes, the electrical potential difference between nodes 41 and 43 will change. This electrical potential difference between nodes 41 and 43 serves as the output for the bridge structure.

Typically a biasing magnetic field is provided to each of magnetoresistors 37, 38, 39, and 40 in order to insure that each operates in the most nearly linear region of its response curve. Such magnetic biasing fields are typically provided by permanent magnets, not shown, formed adjacent to the magnetoresistors. Such permanent magnets may be of cobalt. Alternatively the magnetic biasing fields may be provided by electrical conductor means positioned adjacent to the magnetoresistors and adapted to conduct substantially constant electrical currents. The magnetic fields associated with these substantially constant electrical currents may then act as magnetic biasing fields.

Electrical conductor means 55 and 56 are electrically connected to nodes 41 and 43 respectively. Electrical conductor means 55 and 56 are further electrically connected to input regions 57 and 58 of differential amplifier 59. The output signal appearing at output region 60 of differential amplifier 59 will be proportional to the electrical potential difference between input regions 57 and 58 of differential amplifier 59, if differential amplifier 59 is linear. Therefore, the output signal appearing at output region 60 of differential amplifier 59 will be representative of the input signal applied at input regions 53 and 54 of isolation device 13.

Also shown in FIG. 3 is variable resistor 61. Variable resistor 61 is provided to allow control of the gain of differential amplifier 59. Variable resistor 61 may be controlled by an automatic gain control circuit, a manual gain control, or other controlling means well known in the art.

Those skilled in the art will recognize that if a plurality of isolation devices such as the one shown in FIG. 3 are provided on a monolithic integrated circuit, sufficient separation must be maintained between adjacent isolation devices to prevent cross talk among the devices. This is because a magnetic field produced by an electrical current in electrical conductor means 49, 50, 51, or 52 of one such device could affect the electrical resistance of a magnetoresistor of another isolation device. Typical integrated circuit spacings will prevent significant cross talk, however. For example, if two such devices are provided horizontally with respect to one another, they may be separated by a spacing of approximately two mils. Such separation would be sufficient to eliminate cross talk due to overlapping of the magnetic fields from current straps 48, 49, 50, and 51 of adjacent isolation devices. Electrical isolation between adjacent sensors may be provided by means of dielectric isolation or pn junction isolation, both of which are techniques which are well known in the art.

The embodiments of the invention in which an exclusive property or right is claimed are defined as follows:

1. Apparatus having a plurality of electrical isolation means provided on a monolithic integrated circuit, each of said electrical isolation means being adapted to receive an input signal at an electrical isolation means input terminating region and to provide an output signal at an electrical isolation means output terminating region, said output signal being representative of said input signal, said electrical isolation means input terminating region and said electrical isolation means output terminating region being electrically isolated from one another and each of said isolation means comprising a first electrical impedance means having first and second terminating regions and being capable of changing in electrical impedance in response to a change in a first magnetic field, said first electrical impedance means being adapted to have a first electrical current established therethrough, and a first electrical conductor means proximate to said first electrical impedance means, said first electrical conductor means being electrically connected to said electrical isolation means input terminating region and being adapted to conduct a second electrical current representative of said input signal.

2. The apparatus of claim 1 wherein each of said electrical isolation means of said plurality thereof further comprises a first magnetic biasing means adapted to provide a first substantially constant magnetic biasing field at said first electrical impedance means.

3. The apparatus of claim 2 wherein each of said first electrical impedance mean includes a first magnetoresistive means.

4. The apparatus of claim 3 wherein each of said first magnetic biasing means includes a permanent magnet.

5. The apparatus of claim 3 wherein each of said magnetic field biasing means includes a first magnetic biasing means electrical conductor means, said first magnetic biasing means electrical conductor means being adapted to conduct a substantially constant electrical current.

6. The apparatus of claim 4 or claim 5 wherein each of said first magnetoresistive means includes a nickel-iron alloy.

7. The apparatus of claim 1 wherein each of said electrical isolation means further comprises:

second, third, and fourth electrical impedance means, each of said second, third, and fourth electrical impedance means having first and second terminating regions, said second electrical impedance means being capable of changing in electrical impedance in response to a change in a second field, said second electrical impedance means being adapted to have a third electrical current established therethrough, said third electrical impedance means being capable of changing in electrical impedance in response to a change in a third magnetic field, said third electrical impedance means being adapted to have a fourth electrical current established therethrough, said fourth electrical impedance means being capable of changing in electrical impedance in response to a change in a fourth magnetic field, said fourth electrical impedance means being adapted to have a fifth electrical current established therethrough, said first electrical impedance means first terminating region being electrically connected to said second electrical impedance means first terminating region, said first electrical impedance means second terminating region being electrically connected to said third electrical impedance means second terminating region, said second electrical impedance means second terminating region being electrically connected to said fourth electrical impedance means second terminating region and said third electrical impedance means first terminating region being electrically connected to said fourth electrical impedance means first terminating region;

second electrical conductor means proximate to said second electrical impedance means, said second electrical conductor means adapted to conduct a sixth electrical current representative of said input signal;

third electrical conductor means proximate to said third electrical impedance means, said third electrical conductor means being adapted to conduct a seventh electrical current representative of said input signal; and a fourth electrical conductor means proximate to said fourth electrical impedance means, said fourth electrical conductor means being adapted to conduct an eighth electrical current representative of said input signal.

8. The apparatus of claim 7 wherein said first electrical impedance means includes a first magnetoresistive means, said second electrical impedance means includes a second electrical magnetoresistive means, said third electrical impedance means includes a third magnetoresistive means, and said fourth electrical impedance means includes a fourth magnetoresistive means.

9. The apparatus of claim 8 wherein each of said electrical isolation means of said plurality thereof further comprises:

a first magnetic field biasing means capable of providing a first substantially constant magnetic biasing field at said first electrical impedance means;

a second magnetic field biasing means capable of providing a second substantially constant magnetic biasing field at said second electrical impedance means;

a third magnetic field biasing means capable of providing a third substantially constant magnetic biasing field at said third electrical impedance means; and a fourth magnetic field biasing means capable of providing a fourth substantially constant magnetic biasing field at said fourth electrical impedance means.

10. The apparatus of claim 9 wherein each of said first, second, third, and fourth magnetic field biasing means includes a permanent magnet.

11. The apparatus of claim 9 wherein said first magnetic field biasing means includes a first magnetic field biasing means electrical conductor means, said second magnetic field biasing means includes a second magnetic field biasing means electrical conductor means, said third magnetic field biasing means includes a third magnetic field biasing means electrical conductor means, and said fourth magnetic field biasing means includes a fourth magnetic field biasing means electrical conductor means, each of said first, second, third, and fourth magnetic field biasing means electrical conductor means being adapted to conduct a substantially constant electric current.

12. The apparatus of claim 10 or claim 11 wherein each of said first, second, third, and fourth magnetoresistive means includes a nickel-iron alloy.

* * * * *

UNITED STATES PATENT AND TRADEMARK OFFICE
CERTIFICATE OF CORRECTION

PATENT NO. : 4,441,072
DATED : April 3, 1984
INVENTOR(S) : Mona A. Rahman

It is certified that error appears in the above-identified patent and that said Letters Patent is hereby corrected as shown below:

Column 6, line 6, after "second" insert -- magnetic --.

Column 6, line 51, delete "electrical".

Signed and Sealed this

Fourth Day of September 1984

[SEAL]

Attest:

GERALD J. MOSSINGHOFF

Attesting Officer

Commissioner of Patents and Trademarks